(12) United States Patent
Shimotsu

(10) Patent No.: US 7,586,964 B2
(45) Date of Patent: Sep. 8, 2009

(54) LASER PACKAGE AND LASER MODULE

(75) Inventor: Shinichi Shimotsu, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 128 days.

(21) Appl. No.: 11/487,467

(22) Filed: Jul. 17, 2006

(65) Prior Publication Data

US 2007/0014321 A1  Jan. 18, 2007

(30) Foreign Application Priority Data

Jul. 15, 2005  (JP) ............... 2005-207491

(51) Int. Cl.
*H01S 3/04* (2006.01)
(52) U.S. Cl. ............... 372/36; 372/34; 257/706; 257/717
(58) Field of Classification Search ............... 372/34, 372/36; 257/706, 717
See application file for complete search history.

(56) References Cited

U.S. PATENT DOCUMENTS 5,327,443 A * 7/1994 Tanaka et al. ............... 372/36

2005/0286580 A1 * 12/2005 Oka ............... 372/36
2006/0146899 A1 * 7/2006 Song ............... 372/38.1

FOREIGN PATENT DOCUMENTS

JP  9-307162 A  11/1997

* cited by examiner

*Primary Examiner*—Minsun Harvey
*Assistant Examiner*—Tod T Van Roy
(74) *Attorney, Agent, or Firm*—Sughrue Mion, PLLC

(57) ABSTRACT

A laser package has at least one laser device and a hermetically sealed package including a package base and a cap having a light transmissive window for emitting light. The at least one laser device is placed in the package and fixed onto the package base. Further, a plurality of lead pins including a lead pin for supplying drive current to the laser device projects from the package base. Further, surface insulating processing has been performed on a projecting portion of at least one of the lead pins. The projecting portion is a portion which projects from the package base to the outside of the laser base.

2 Claims, 6 Drawing Sheets

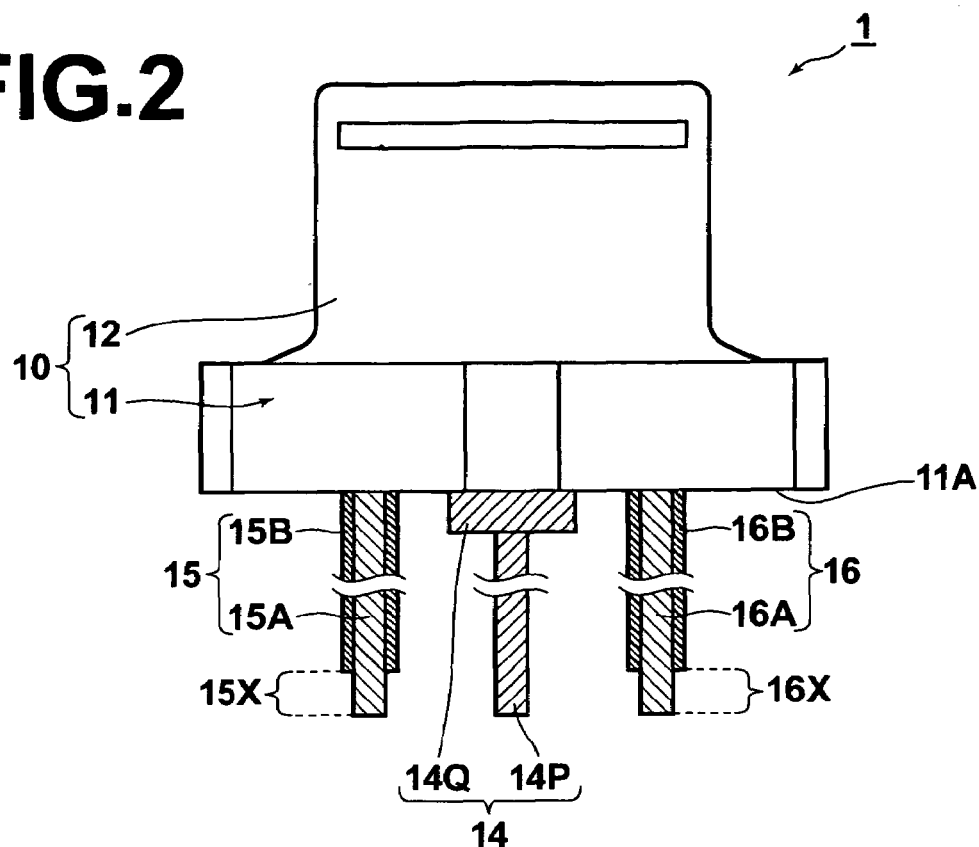
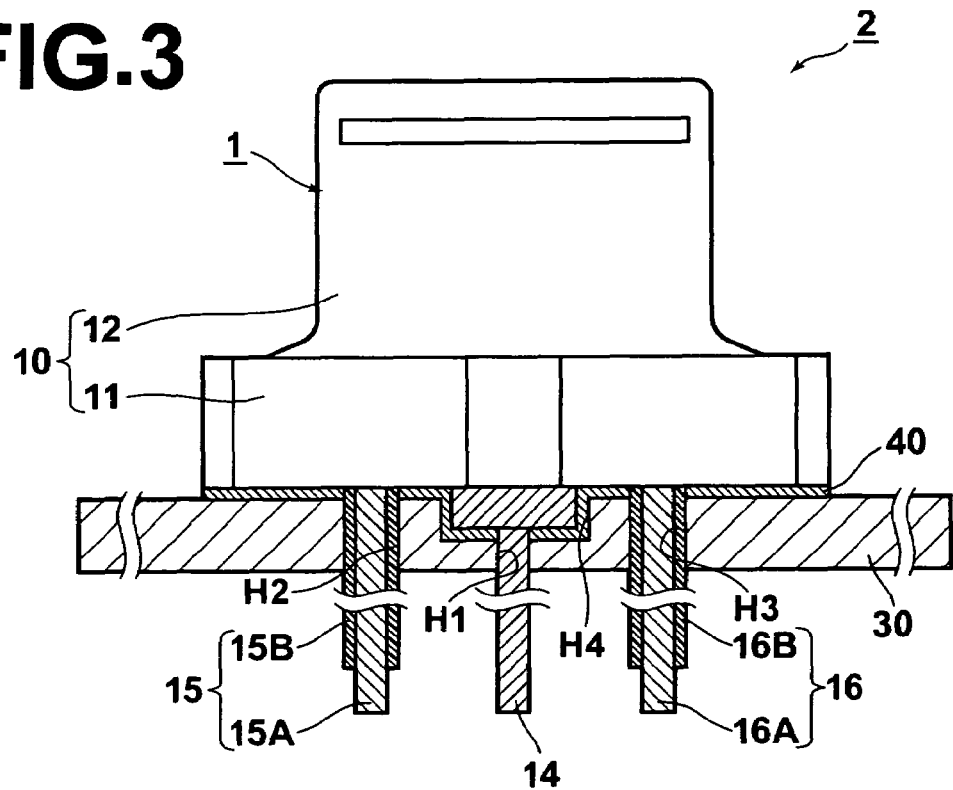

LASER PACKAGE AND LASER MODULE

BACKGROUND OF THE INVENTION

1. Field of the Invention

The present invention relates to a laser package, in which a laser device or laser devices are placed in a hermetically sealed package. The present invention also relates to a laser module in which the laser package is provided.

2. Description of the Related Art

A laser package which includes a laser device or laser devices and a hermetically sealed package having a package base and a cap with a light transmissive window for emitting light is well known. In such a laser package, the laser device or laser devices are placed in the hermetically sealed package. In the laser package, the laser device or laser devices are normally fixed onto the package base, and a plurality of lead pins including a lead pin for supplying drive current to the laser device or laser devices projects from the package base.

The package base and the cap are fixed to each other by welding. Generally, an Fe-based material such as stainless steel (SUS: steel use stainless), which has low thermal conductivity, is used as a material for the package base and the cap. Such a material is used because of its weldability, its heat transfer suppression characteristic of preventing transfer of welding heat to the laser device or devices or the like. The thermal conductivity of the stainless steel is approximately 16 W/m·K.

Conventionally, relatively low output laser devices, such as an infrared semiconductor laser device with an oscillation wavelength of 980 nm/an output power of 90 mW, have been used as laser devices. The electric/photo-conversion efficiency of the infrared semiconductor laser device is within a range of 40% to 60%. Further, it is estimated that heat from a laser device is within a range of 60 to 135 mW when the output power is at 90 mW.

In recent years, use of higher output laser devices, such an ultraviolet semiconductor laser device, as the laser devices has been considered. The ultraviolet semiconductor laser device is a laser device, such as a GaN-based semiconductor laser device with an output power of approximately 200 mW, for example. The electric/photo-conversion efficiency of the ultraviolet semiconductor laser device is within a range of 20% to 25%. Further, it is estimated that heat from a laser device is within a range of 0.6 to 0.8 W when the output power is at 200 mW. Since the heat generated by the ultraviolet laser device is approximately five to six times of the heat generated by the infrared semiconductor laser device, if a holder made of stainless steel (SUS), which has low thermal conductivity, is used for the ultraviolet laser device, it is impossible to sufficiently radiate heat from the ultraviolet laser device. If the heat is insufficiently radiated from the laser device, the life of the laser package becomes short because of deterioration of the laser device or the like due to the heat.

As a structure for radiating heat from a laser device, a structure illustrated in FIG. 7A has been proposed. In FIG. 7A, a heat radiation plate 130, which has efficient thermal conductivity, is attached to the bottom of a package base 111 of a laser package 110. The heat radiation plate 130 has one insertion hole 131 through which a plurality of lead pins 114 is inserted together. In the structure illustrated in FIG. 7A, the package base 111 and the heat radiation plate 130 are joined together through silicon grease or the like (omitted in FIG. 7A) so as to cause them to be more closely contacted with each other. The package base 111 and the heat radiation plate 130 are closely contacted with each other through the silicon grease or the like to reduce contact resistance therebetween.

FIG. 7A is a side view of the laser package. In FIG. 7A, a cross-section of the heat radiation plate 130 is illustrated. Further, a cap 112 of the laser package 110 is illustrated in FIG. 7A.

A heat radiation structure is disclosed in Japanese Unexamined Patent Publication No. 9(1997)-307162. In Japanese Unexamined Patent Publication No. 9(1997)-307162, a laser package is housed in an insulating outer case (7) and a heat radiation plate (8) is provided. The heat radiation plate (8) abuts on a part of the outer circumstance of the bottom of a package base. Further, the heat radiation plate (8) connects a lead pin (11-1) for supplying drive current to a laser device to the insulating outer case (7). Further, a condenser (9) is mounted on the heat radiation plate (8). In this paragraph, the reference numerals in the brackets are reference numerals which are used in Japanese Unexamined Patent Publication No. 9(1997)-307162.

Alternatively, a technique in which a Peltier device (cooling device) 150 is attached to the bottom of a package base 111 of a laser package 110 has been proposed, as illustrated in FIG. 7B. In this technique, insertion holes 151 are formed on the Peltier device 150, and each of a plurality of lead pins 114 is inserted into respective insertion holes 151.

Although there are some exceptions, materials with efficient thermal conductivity tend to have efficient electrical conductivity. In the heat radiation structure illustrated in FIG. 7A, the heat radiation plate made of Cu, Al or the like is used. Therefore, it is necessary to form an opening of the insertion hole on the heat radiation plate so that the diameter of the insertion hole is sufficiently large, thereby preventing the plurality of lead pins from contacting the inner wall of the insertion hole. The plurality of lead pins should not contact the inner wall of the insertion hole to prevent short circuit between the lead pins. Therefore, in a conventional structure, only the outer circumference portion on the bottom of the package base abuts on the heat radiation plate. Hence, it is difficult to cause the laser package and the heat radiation plate to contact with each other at a sufficiently large contact area. Further, there is a tendency that temperature at a central portion on the bottom of the package base, surrounded by the plurality of lead pins, becomes higher than temperature at the outer circumference on the bottom of the package base. However, in the conventional structure, it is impossible to cause the high temperature portion at the center to contact with the heat radiation plate. As described above, the heat radiation efficiency of the heat radiation structure illustrated in FIG. 7A is low. Hence, the heat radiation structure is insufficient to cope with use of a high output laser device, such as a GaN-based laser device.

In the heat radiation structure disclosed in Japanese Unexamined Patent Publication No. 9(1997)-307162, the temperature at the center of the bottom of the package base becomes particularly high. However, it is impossible to attach the heat radiation plate (8) to the center of the bottom of the package base (reference numeral (8) is a reference numeral in Japanese Unexamined Patent Publication No. 9(1997)-307162). This condition is the same as the condition in the heat radiation structure illustrated in FIG. 7A.

In the heat radiation structure illustrated in FIG. 7B, the Peltier device is attached to the bottom of the package base. Therefore, it is possible to more efficiently radiate heat than a structure using a heat radiation plate. However, in the heat radiation structure illustrated in FIG. 7B, it is necessary to form an opening of the insertion hole on the Peltier device so that the diameter of the insertion hole is sufficiently large, thereby preventing the lead pin from contacting the inner wall of the insertion hole. The lead pin should not contact the inner wall of the insertion hole to prevent short circuit with a wire in the Peltier device. In the heat radiation structure illustrated in FIG. 7B, the temperature at the center of the bottom of the package base becomes particularly high. However, it is impossible to cause a central portion on the bottom of the package base and the Peltier device to efficiently contact with each other. This condition is the same as the condition in the heat radiation structure illustrated in FIG. 7A.

If the diameter of a lead pin is larger, heat may be efficiently radiated from the lead pin. However, in such a case, it is necessary to use a special package, and the cost of the laser package becomes high.

Alternatively, a heat radiation plate or the like may be attached to the side and/or the upper surface of a laser package to increase a heat radiation area. However, even if the heat radiation plate or the like is attached to a position which is apart from a high heat generation portion at the center of the bottom of the package base, it is impossible to achieve an efficient heat radiation characteristic. Especially, when the package is made of a low thermal conductivity material, such as stainless steel, it is impossible to achieve an efficient heat radiation characteristic because the package per se has substantial resistance.

SUMMARY OF THE INVENTION

In view of the foregoing circumstances, it is an object of the present invention to provide a laser package which can cope with use of a high output laser device, such as a GaN-based laser device, by improving a heat radiation characteristic at a central portion on the bottom of a package base of the laser package. The central portion of the bottom of the package base is a portion at which temperature becomes particularly high, and if the heat radiation characteristic at the central portion is improved, a heat radiation characteristic of the whole laser package can be improved. Further, it is also an object of the present invention to provide a laser module using such a laser package.

A laser package according to the present invention is a laser package comprising:

at least one laser device; and a hermetically sealed package including a package base and a cap having a light transmissive window for emitting light, wherein the at least one laser device is placed in the package and fixed onto the package base, and wherein a plurality of lead pins including a lead pin for supplying drive current to the laser device projects from the package base, and wherein surface insulating processing has been performed on an projecting portion of at least one of the lead pins, and wherein the projecting portion is a portion which projects from the package base to the outside of the laser base.

In the laser package according to the present invention, it is preferable that the lead pin, on which surface insulating processing has been performed, is a lead pin coated with one of an insulating resin tube and an insulating resin layer. Further, it is preferable that one of the insulating resin tube and the insulating resin layer with which the lead pin is coated is made of polyimide resin.

In a laser package according to the present invention, it is preferable that a flexible heat radiation member having at least one insertion hole for inserting the lead pin/pins therethrough is attached to the bottom of the package base and that the thermal conductivity of the flexible heat radiation member is higher than that of the package base.

In the specification of the present application, the phrase "bottom of the package base" refers to a surface of the package base on the side opposite to the cap.

Particularly, it is preferable that the surface insulating processing has been performed on at least all of the plurality of lead pins except one arbitrary lead pin and that the at least one insertion hole is formed on the flexible heat radiation member so that the number and the position/positions of the at least one insertion hole correspond to those of the lead pins. Further, it is preferable that the opening of each of the at least one insertion hole has a diameter which does not form a substantial gap (space) between the insertion hole and the lead pin/pins inserted therethrough and that the entire surface of the bottom of the package base except a portion/portions to which the lead pin/pins are attached is substantially covered with the flexible heat radiation member.

In the specification of the present application, the expression "does not form a substantial gap" means that the structure is basically designed so as not to form a gap, however the diameter of the insertion hole may be set, by considering the accuracy in size among the members of the laser package, so as to allow for some variations in the size. Further, the expression "the entire surface . . . is substantially covered" means that some part of an outer circumference portion on the outside of a portion or portions to which the lead pin or pins are attached may be uncovered.

It is preferable that the thermal conductivity of the flexible heat radiation member is more than or equal to 500 W/m·K. Further, it is preferable that the flexible heat radiation member is made of electrically conductive carbon.

Further, the laser package according to the present invention is effective when the laser device is a GaN-based semiconductor laser device.

A laser module according to the present invention is a laser module comprising:

a laser package including at least one laser device and a hermetically sealed package having a package base and a cap having a light transmissive window for emitting light, wherein the at least one laser device is placed in the package; and a heat radiation support for supporting the package base of the laser package from the bottom of the package base, and wherein the thermal conductivity of the heat radiation support is higher than that of the package base, and wherein the laser device is fixed onto the package base of the laser package, and wherein a plurality of lead pins including a lead pin for supplying drive current to the laser device projects from the package base of the laser package, and wherein the heat radiation support has at least one insertion hole for inserting the lead pin/pins therethrough, and wherein surface insulating processing has been performed on a projecting portion of at least one of the lead pins and/or the inner surface of at least one of the at least one insertion hole, and wherein the projecting portion of at least one of the lead pins is a portion which projects from the package base to the outside of the laser package.

In a laser module according to the present invention, it is preferable that the lead pin and/or the insertion hole, on which surface insulating processing has been performed, are a lead pin and/or an insertion hole, each coated with one of an insulating resin tube and an insulating resin layer.

In a laser module according to the present invention, it is preferable that the at least one insertion hole is formed on the heat radiation support so that the number and the position/positions of the at least one insertion hole correspond to those of the lead pins and that the opening of each of the at least one insertion hole has a diameter which does not form a substantial gap between the insertion hole and the lead pin/pins inserted therethrough. Further, it is preferable that the entire surface of the bottom of the package base except a portion/ portions to which the lead pin/pins are attached is substantially covered with the heat radiation support.

In the laser module according to the present invention, it is preferable that the package base is supported by the heat radiation support through a flexible heat radiation member having at least one insertion hole for inserting the lead pin/pins therethrough and that the thermal conductivity of the flexible heat radiation member is higher than that of the package base.

Particularly, it is preferable that the heat radiation support has a base plate and a side wall and that the base plate supports the bottom of the package base. Further, it is preferable that the area of the base plate is larger than that of the bottom of the package base and that the side wall is arranged at a position on the base plate to be spaced from the laser package and to face the laser package. Further, it is preferable that the flexible heat radiation member has a portion between the bottom of the package base and the base plate and a portion extending from the portion between the bottom of the package base and the base plate so as to be connected to the side wall.

In the laser package according to the present invention, a plurality of lead pins including a lead pin for supplying drive current to a laser device projects from a package base. Further, surface insulating processing has been performed on a projecting portion of at least one of the lead pins, and the projection portion is a portion projecting from the package base to the outside of the laser base.

In the laser package according to the present invention, it is possible to attach a heat radiation member, such as a heat radiation support (a heat radiation plate or the like) and a cooling device (Peltier device or the like), to a laser package without considering a risk of short circuit between lead pins for a lead pin on which surface insulating processing has been performed. Further, it is not necessary to provide space between the lead pin on which surface insulating processing has been performed and the heat radiation member. Therefore, it is possible to obtain a larger contact area between the laser package and the heat radiation member than a contact area obtained in a structure according to a conventional technique. Further, since the heat radiation characteristic at the center of the bottom of the package, at which the temperature becomes particularly high, can be improved, it is possible to improve the heat radiation characteristic of the whole laser package.

A laser module according to the present invention includes a laser package and a heat radiation support for supporting the package base of the laser package from the bottom of the package base. Further, in the laser module according to the present invention, the thermal conductivity of the heat radiation support is higher than that of the package base. In the laser module according to the present invention, a plurality of lead pins including a lead pin for supplying drive current to the laser device projects from the package base of the laser package. Further, the heat radiation support has one insertion hole or a plurality of insertion holes through which the lead pin or pins are inserted. Further, surface insulating processing has been performed on a projecting portion of at least one lead pin and/or the inner surface of at least one insertion hole, and the projecting portion is a portion projecting from the package base to the outside of the package base.

In the laser module according to the present invention, it is not necessary to consider a risk of short circuit between lead pins for the portion on which the surface insulating processing has been performed. Further, it is not necessary to provide space between the lead pin and the insertion hole through which the lead pin is inserted. Therefore, it is possible to obtain a larger contact area between the laser package and the heat radiation support than a contact area obtained in a structure according to a conventional technique. Further, since the heat radiation characteristic at the center of the bottom of the package, at which the temperature becomes particularly high, can be improved, it is possible to improve the heat radiation characteristic of the whole laser package.

BRIEF DESCRIPTION OF THE DRAWINGS

FIG. 2 is a schematic diagram illustrating a cross-sectional structure of a lead pin of the laser package illustrated in FIGS. 1A through 1D;

FIG. 3 is a diagram illustrating the structure of a laser module according to an embodiment of the present invention;

DESCRIPTION OF THE PREFERRED EMBODIMENTS

Figure 1A:
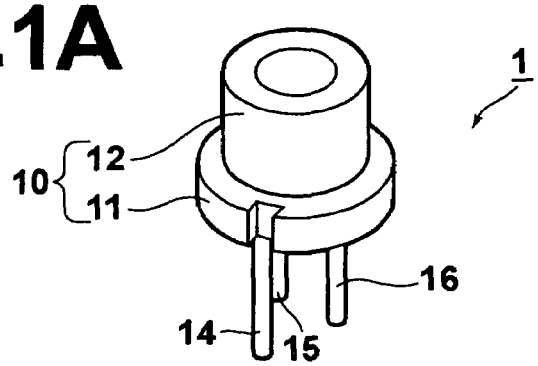
FIG. 1A is a diagram illustrating the structure of a laser package according to an embodiment of the present invention.
Figure 1B:
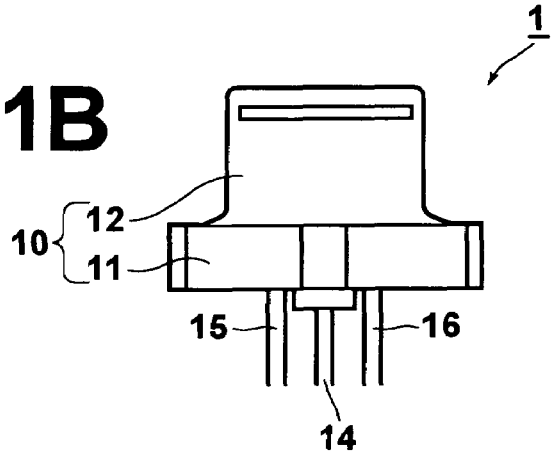
FIG. 1B is a diagram illustrating the structure of a laser package according to an embodiment of the present invention.
Figure 1C:
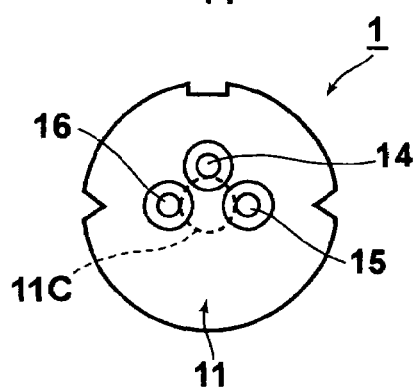
FIG. 1C is a diagram illustrating the structure of a laser package according to an embodiment of the present invention.
Figure 1D:
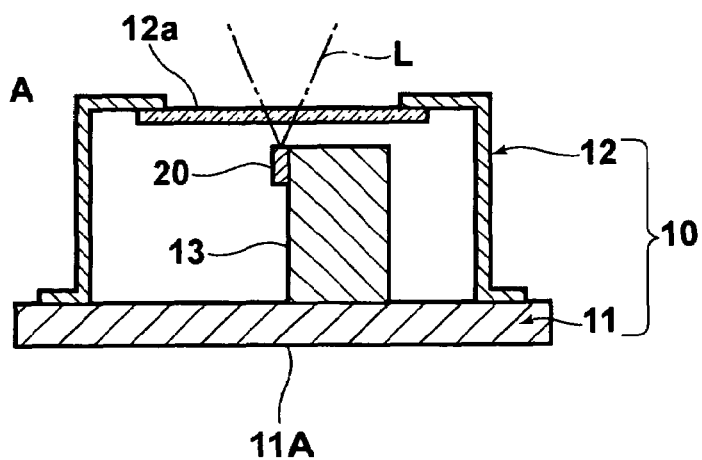
FIG. 1D is a diagram illustrating the structure of a laser package according to an embodiment of the present invention.

The structure of a laser package according to an embodiment of the present invention and the structure of a laser module including the laser package will be described with reference drawings. FIG. 1A is a perspective view of the laser package. FIG. 1B is a side view of the laser package, and FIG. 1C is a bottom view of the laser package. FIG. 1D is a vertical sectional view of the laser package at a cross-section including the central axis of the laser package (lead pins are omitted). FIG. 2 is a schematic diagram illustrating the cross-sectional structure of lead pins. In FIG. 2, regarding a can package, a side view of the can package is illustrated. In FIG. 2, a sectional view of the lead pins at a cross-section including the central axis of each of the lead pins is illustrated. In FIG. 2, three lead pins which are not actually positioned on the same cross-sectional plane are illustrated on the same cross-sectional plane so as to be easily recognized. FIG. 3 is a schematic diagram of a laser module, and FIG. 3 is a diagram corresponding to FIG. 2. In FIG. 3, a side view of the can package is illustrated, and a cross-sectional view of the lead pins and a heat radiation support is illustrated.

As illustrated in FIGS. 1A through 1D, a laser package 1 includes a single laser device 20 and a hermetically sealed can package 10, and the laser package 1 is placed in the can package 10. The can package 10 includes a disk-shaped package base 11 and a cap 12. The cross-sectional shape of the cap 12 is substantially a C-shape, and the cap 12 has a light transmissive window 12a for emitting light. The package base 11 and the cap 12 are hermetically attached to each other by resistance welding (seamless welding).

The laser device 20 is mounted and fixed to a heat radiation block 13 protruding from the package base 11 of the can package 10 through a brazing material (AuSn, In or the like) by using a well-known method. The laser device 20 is placed so that the light-emission surface of the laser device 20 faces the light-transmissive window 12a of the can package 10. In FIG. 1D, light L emitted from the laser is illustrated.

As the laser device 20, any kinds of laser device may be used. For example, a semiconductor laser device, such as a GaN-based laser device (370 to 450 nm), an AlGaInP-based laser device (580 to 690 nm), an InGaP-based laser device (650 to 1000 nm), an AlGaAs-based laser device (700 to 1000 nm), a GaAsP-based laser device (700 to 1000 nm), an InGaAs-based laser device (1000 to 3500 nm), an InAsP-based laser device (1000 to 3500 nm) or the like, may be used. These numbers in the brackets represent the oscillation wavelength band of each of the laser devices.

It is needless to say that the laser package 1 according to the present embodiment can cope with an infrared semiconductor laser device, which has been generally used, and which has relatively low output power. Further, the laser package 1 according to the present embodiment can also cope with an ultraviolet semiconductor laser device (a GaN-based laser device or the like with an oscillation wavelength within a range of 350 to 500 nm and with output power of approximately 200 nm, for example), which has high output power.

As a material for the package base 11, a material which has low thermal conductivity, and of which the thermal expansion coefficient is close to that of a sealing material for lead pins 14 through 16, is used to suppress thermal diffusion during welding of the package base 11 and the cap 12. As a material for the package base 11, an Fe—Ni—Co alloy (thermal conductivity: 10 W/m·K), an Fe—Ni alloy (thermal conductivity: 10 W/m·K), a Cu—W alloy (thermal conductivity: 200 W/m·K) or the like is used. As a material for the cap 12, an Fe—Ni—Co alloy (thermal conductivity: 14 W/m·K), an Fe—Ni alloy (Fe content 42%, thermal conductivity: 14 W/m·K) or the like is used. As a material for the light-transmissive window 12a, glass or the like is used. As a material for the heat radiation block 13, Cu (thermal conductivity: 395 W/m·K), Al (thermal conductivity: 238 W/m·K) or the like is used.

As illustrated in FIGS. 1A through 1D and FIG. 2, three lead pins 14 through 16 project from the package base 11. All of the three lead pins 14 through 16 are arranged at an approximately equal distance from the center of the package base 11. Further, the three lead pins 14 through 16 are substantially arranged on the same circumference, being spaced from each other.

The lead pin 14 is a lead pin for fixing, of which the potential is the same as that of the package 10. The lead pin 14 is formed so that the diameter of a portion 14Q is larger than that of a portion 14P. The portion 14Q includes a portion which is connected to the inside of the package 10, and at which the lead pin 14 projects from the package base 11, and a portion in the vicinity thereof. The portion 14P is a portion on the leading edge side of the portion 14Q. The portion 14Q and the portion 14P are formed in such a manner because of constraint in production of the package. Further, the portion 14Q and the portion 14P are formed in such a manner so as to easily mount a heat radiation support 30, which will be described later, on the laser package 1. Hereinafter, the portion 14P is referred to as a small diameter portion, and the portion 14Q is referred to as a large diameter portion.

The lead pin 15 is a lead pin for supplying electricity. The lead pin 15 supplies drive current to the laser device 20. The lead pin 16 is a lead pin for a light detection device, such as a photodiode, for detecting the light amount of the laser device 20, which is mounted on the heat radiation block 13. The lead pins 15 and 16 project from the inside of the package 10 to the outside of the package 10 through the package base 11. Each of the lead pins 15 and 16 is electrically connected to the laser device 20 or the light detection device in the package 10.

In the present embodiment, surface insulating processing is performed on projecting portions of all of the lead pins except the lead pin 14, namely the lead pins 15 and 16, and the projecting portions are portions which project from the package base 11 to the outside of the package 10. Specifically, the lead pin 15 includes an electrically conductive wiring portion 15A and an insulating coating 15B, which coats the electrically conductive wiring portion 15A. Further, the lead pin 16 includes an electrically conductive wiring portion 16A and an insulating coating 16B, which coats the electrically conductive wiring portion 16A. In the lead pins 15 and 16, surface insulating processing is performed with the insulating coatings 15B and 16B, respectively. The electrically conductive wiring portions 15A and 16A correspond to conventional lead pins.

In the lead pin 15, surface insulating processing is substantially performed on the entire surface of a projecting portion of the lead pin 15, which projects from the package base 11 to the outside of the package base 11, except a mounting-side leading edge portion 15X of the lead pin 15 (a portion which is mounted and fixed to various kinds of module through solder or the like when the laser package 1 is mounted on various kinds of module or the like). In the lead pin 16, surface insulating processing is substantially performed on the entire surface of a projecting portion of the lead pin 16, which projects from the package base 11 to the outside of the package base 11, except a mounting-side leading edge portion 16X of the lead pin 16 (a portion which is mounted and fixed to various kinds of module through solder or the like when the laser package 1 is mounted on various kinds of module or the like).

Alternatively, the mounting-side leading edge portions 15X and 16X may be also coated with the insulating coatings 15B and 16B, respectively. Then, when the laser package 1 is mounted or before the laser package 1 is mounted, the insulating coatings 15B and 16B at the mounting-side leading edge portions 15X and 16X may be removed to expose the electrically conductive wiring portions 15A and 16B.

It is preferable that the insulating coatings 15B and 16B abut the bottom 11A of the package base 11. However, a very small gap may be formed between the insulating coating 15B and the bottom 11A of the package base 11 and between the insulating coating 16B and the bottom 11A of the package base 11 as long as a risk of short circuit between the lead pins through a heat radiation support 30 and a flexible heat radiation member 40, which will be described later, is not substantial.

The insulating coatings 15B and 16B may be any kinds of insulating coatings. However, it is preferable to use an insulating resin tube or an insulating resin layer for coating. Further, insulating resin forming the insulating coatings 15B and 16B is not particularly limited. However, it is preferable that the insulating resin has a sufficient heat resistant property when the leading edge portions 15X and 16X of the lead pins 15 and 16 are mounted by soldering or the like. Specifically, it is preferable to use resin, of which the glass transition temperature (Tg) is higher than or equal to 220° C. As an example of such insulating resin, there is polyimide resin (Tg: 220-400° C.) or the like.

Polyimide resin is resin containing one kind or two or more kinds of polyimide, such as a polycondensation polymer of one of tetracarboxylic acid and its acid anhydride and diamine. There are various types of polyimide by combination of one of a carboxylic acid component and its acid anhydride component and a diamine component. As an example of polyimide, there is a polycondensation polymer of pyromellitic acid dianhydride and 4,4'-diaminodiphenylether, or the like. The polyimide resin may contain an arbitrary component, such as resin other than polyimide and various kinds of dopant, if necessary.

Coating may be provided on the electrically conductive wiring potions 15A and 16A (conventional lead pins) with the insulating coatings 15B and 16B by inserting each of the electrically conductive wiring portions 15A and 16A into an insulating resin tube.

Alternatively, coating may be provided on the electrically conductive wiring potions 15A and 16A with the insulating coatings 15B and 16B by electric deposition or the like. Electric deposition is performed by dunking the electrically conductive wiring portions 15A and 16A in a solution containing one kind or two or more kinds of polyimide and/or polyamide acid, which is polyimide precursor, or the like. Accordingly, an insulating resin layer made of polyimide resin may be formed on the surface of each of the electrically conductive wiring portions 15A and 16A.

When the lead pins 14 through 16 are mounted by inserting the leading edges of the lead pins 14 through 16 into sockets or the like without performing thermal processing, such as mounting by soldering, it is not necessary that the leading edges of the lead pins 14 through 16 have high heat resistant properties. Therefore, in such cases, arbitrary insulating resin may be used as the material for the insulating coatings 15B and 16B.

For example, a photo-curing type or thermal-curing type adhesive containing a curable monomer and/or a curable prepolymer and a polymerization initiator may be coated on the electrically conductive wiring portions 15A and 16A to form uncured coatings. Then, the uncured coatings may be cured by irradiating the coatings with light or by heating. Accordingly, the insulating coatings 15B and 16B, made of insulating resin layers, may be formed. As an example of the photo-curing type adhesive which is used in a preferable manner, there is "UVO-114" (Tg after curing: 50° C.), manufactured by Epoxy Technology, or the like. Further, as an example of the thermal-curing type adhesive which is used in a preferable manner, there is "353ND" (after cure, deterioration starts at 400° C.), manufactured by Epoxy Technology, or the like.

As illustrated in FIG. 3, in a laser module 2 according to the present embodiment, the laser package 1 is attached to a heat radiation support 30 (heat radiation plate) which has higher thermal conductivity than the package base 11, and of which the area is larger than that of the package base 11. The heat radiation support 30 supports the package 11 from the bottom 11A side of the package base 11.

In the laser module 2, the laser package 1 is supported by the heat radiation support 30 through a flexible heat radiation member 40, such as a heat radiation sheet and a heat radiation film. The thermal conductivity of the flexible heat radiation member 40 is higher than that of the package base 11. Further, the shape of the flexible heat radiation member 40 is a flat plane which is substantially the same as the shape of the package base 11. Further, the flexible heat radiation member 40 is more flexible than the heat radiation support 30.

The flexible heat radiation member 40 is arranged along the bottom surface 11A of the package base 11 and the bottom of the large diameter portion 14Q of the lead pin 14. Further, the flexible heat radiation member 40 has insertion holes H1 through H3 formed so as to correspond to the number of the lead pins 14 through 16 and the positions of the lead pins 14 through 16. The diameter of the insertion hole H1 corresponding to the lead pin 14 is approximately the same as the outer diameter of the small diameter portion 14P of the lead pin 14. Further, the diameter of the insertion hole H2 corresponding to the lead pin 15 is set so as to be approximately the same as the outer diameter of the coated portion of the lead pin 15, which is coated with the insulating coating 15B. Further, the diameter of the insertion hole H3 corresponding to the lead pin 16 is set so as to be approximately the same as the outer diameter of the coated portion of the lead pin 16, which is coated with the insulating coating 16B. Specifically, the flexible heat radiation member 40 is arranged in an area between the lead pins 14 through 16 without forming any substantial gap. Further, the flexible heat radiation member 40 is designed so as to cover approximately the entire bottom surface 11A of the package base 11 except portions at which the lead pins 14 through 16 are attached to the package base 11.

As a material for the flexible heat radiation member 40, a material, of which the thermal conductivity is higher than that of the package base 11, and which can be formed into a sheet or film, should be used. The material is not limited as long as the material has such properties. As the material for the flexible heat radiation member 40, a metal, such as Cu (thermal conductivity: 395 W/m·K), Al (thermal conductivity: 238 W/m·K) and an alloy containing Cu and/or Al, electrically conductive carbon (600 to 800 W/m·K) and diamond, may be used.

As the material for the flexible heat radiation member 40, a material, of which the thermal conductivity is more than or equal to 500 W/m·K is preferable, and electrically conductive carbon or the like is preferable. As the electrically conductive carbon, any one of amorphous carbon, microcrystalline or polycrystalline carbon, in which an amorphous portion and a graphite portion are present as a mixture, and graphite may be used. Particularly, graphite, of which the thermal conductivity is high, is preferable.

The heat radiation support 30 is a heat radiation plate on which insertion holes H1 through H3 are formed so as to correspond to the number of the lead pins 14 through 16 and the positions of the lead pins 14 through 16. The diameter of each of the insertion holes formed on the heat radiation support 30 and that of a corresponding insertion hole formed on the flexible heat radiation member 40 are approximately the same. Further, each of the insertion holes formed on the heat radiation support 30 and a corresponding insertion hole formed on the flexible heat radiation member 40 are connected to each other. Therefore, the same reference numeral is used for both of the corresponding insertion holes.

Further, a depression H4 is formed on a surface on a laser package 1 side of the heat radiation support 30. The depression H4 is formed so as to correspond to the shape of the large diameter portion 14Q of the lead pin 14. Specifically, the heat radiation support 30 is arranged in an area between the lead pins 14 through 16 without forming any substantial gap. Further, the heat radiation support 30 is designed so as to cover approximately the entire bottom surface 11A of the package base 11 except portions at which the lead pins 14 through 16 are attached to the package base 11.

As a material for the heat radiation member 30, a material, of which the thermal conductivity is higher than that of the package base 11, should be used. The material is not limited as long as the material has such a property. As the material for the heat radiation member 30, Cu (thermal conductivity: 395 W/m·K), Al (thermal conductivity: 238 W/m·K) and an alloy containing Cu and/or Al or the like may be used.

The laser package 1 and the laser module 2 according to the present embodiment are structured as described above.

In the laser package 1 according to the present embodiment, surface insulating processing (specifically, coating with the insulating coatings 15B and 16B) is performed on a projecting portion of each of all of the lead pins except the lead pin 14, namely the lead pins 15 and 16. The projecting portion of each of the lead pins 15 and 16 is a portion which projects from the package base 11 to the outside of the package base 11.

In the laser package 1 according to the present embodiment, the lead pins are insulated from each other because surface insulating processing has been performed. Hence, it is possible to form the laser module 2 by attaching the heat radiation support 30 to the laser package 1 without considering a risk of short circuit between the lead pins. In the present embodiment, it is not necessary to provide a gap between any of the lead pins 14 through 16 and the heat radiation support 30. Therefore, it is possible to cause the laser package 1 and the heat radiation support 30 to contact with each other at an area wider than a conventional contact area. Further, it is possible to improve a heat radiation characteristic at a central portion 11C (please refer to FIG. 1C) on the bottom of the package base 11, at which the temperature becomes especially high. Therefore, it is possible to improve the heat radiation characteristic of the whole laser package 1.

In the present embodiment, the lead pins are insulated from each other. However, surface insulating processing is not performed on the lead pin 14, which is a lead pin for fixing, and the lead pin 14 directly contacts with the flexible heat radiation member 40 and the heat radiation support 30. Therefore, it is possible to efficiently radiate heat from the lead pin 14, which is positioned in the vicinity of the center portion 11C on the bottom of the package base 11. The center portion 11C is a portion at which the temperature becomes high.

If surface insulating processing is performed on all of the lead pins except an arbitrary lead pin among the lead pins 14 through 16, it is possible to achieve a heat radiation effect by the lead pin on which the surface insulating processing has not been performed while the lead pins are insulated from each other. For the purpose of achieving higher heat radiation efficiency, it is preferable that surface insulating processing is not performed on the lead pin 14, which has the large diameter portion 14Q, and that the lead pin 14 directly contacts with the flexible heat radiation member 40 and the heat radiation support 30.

Further, in the present embodiment, the laser package 10 and the heat radiation support 30 are joined together through the flexible heat radiation member 40, which is soft and flexible. The thermal conductivity of the flexible heat radiation member 40 per se is high, and the flexible heat radiation member 40 is flexible. Therefore, the flexible heat radiation member 40 can function as a member for causing the laser package 10 and the heat radiation support 30 to more closely contact with each other. In the present embodiment, since such a flexible heat radiation member 40 is provided between the laser package 10 and the heat radiation member 30, it is possible to improve the thermal conductivity from the laser package 10 to the heat radiation support 30. Hence, the heat radiation characteristic is improved.

(Design Modification)

The present invention is not limited to the above embodiment. Any kinds of design modification to the present invention may be made without deviating from the gist of the present invention.

In the description of the above embodiment, a case in which the surface insulating processing is not performed on the lead pin 14, which is a lead pin for fixing, has been described.

Figure 4A:
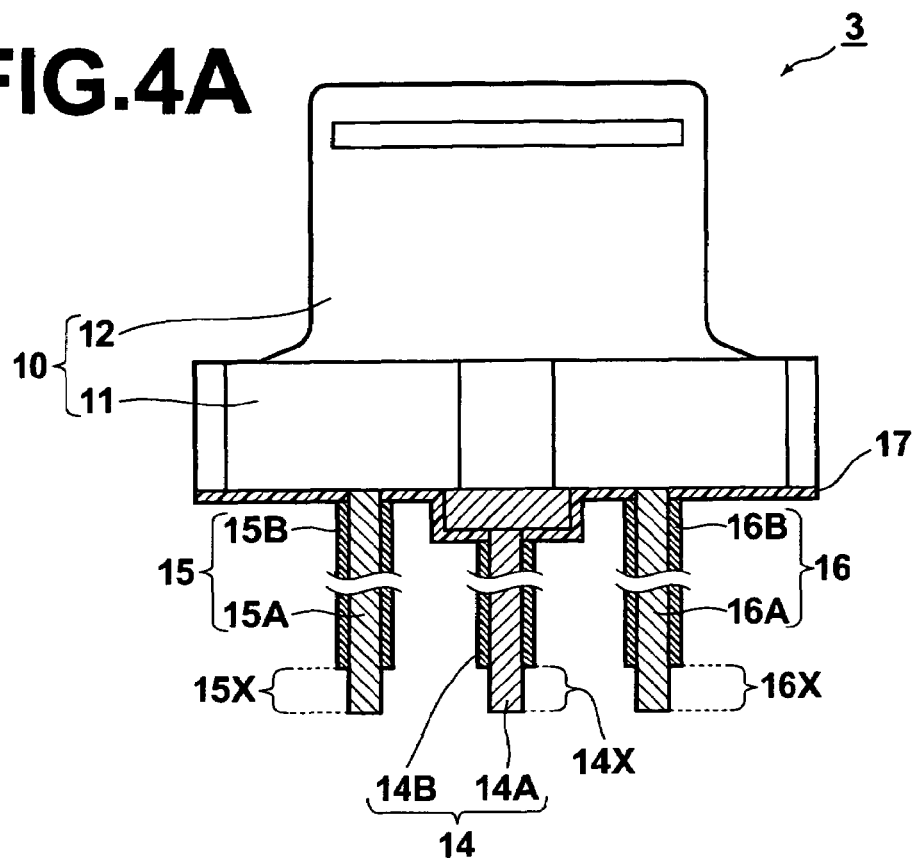
FIG. 4A is a diagram illustrating a design modification example.
Figure 4B:
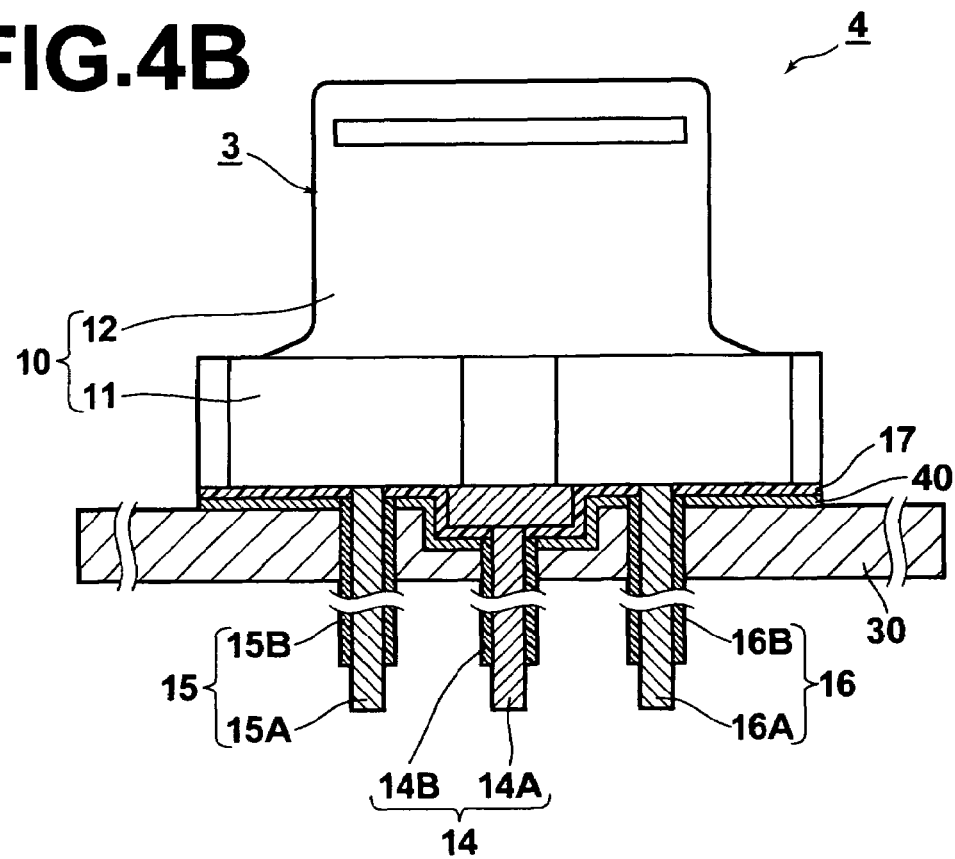
FIG. 4B is a diagram illustrating a design modification example.

However, the present invention is not limited to such a structure, and surface insulating processing may be performed on all of the lead pins 14 through 16. In a laser package 3 illustrated in FIG. 4A, the bottom of the package base 11, the side and the bottom of the large diameter portion 14Q of the lead pin 14 before insulating processing are coated with insulating resin 17. Then, each of the small diameter portion 14P of the lead pin 14 before insulating processing and the lead pins 15 and 16 is coated with an insulating resin tube made of a material, such as polyimide resin. Accordingly, surface insulating processing is performed on all of the lead pins 14 through 16. FIG. 4B illustrates a laser module 4 using the laser package 3. The basic structure of the laser module 4 is similar to that of the laser module 2 in the above embodiment. In FIGS. 4A and 4B, an electrically conductive wiring portion 14A (corresponding to 15A and 16A) of the lead pin 14 and an insulating coating 14B (corresponding to 15B and 16B) are illustrated.

Further, if surface insulating processing is performed at least one of the lead pins, it is possible to attach the heat radiation support to the laser package without considering a risk of short circuit between the lead pins for the lead pin on which the surface insulating processing has been performed. Therefore, it is possible to provide a laser package and a laser module which have more efficient heat radiation characteristic than a conventional technique.

In the above description, surface insulating processing has been performed on at least one of the lead pins. However, in the laser modules 2 and 4, if surface insulating processing is performed on the inner surface of at least one of the insertion holes of the heat radiation support 30, it is possible to achieve a similar advantageous effect.

Figure 5:
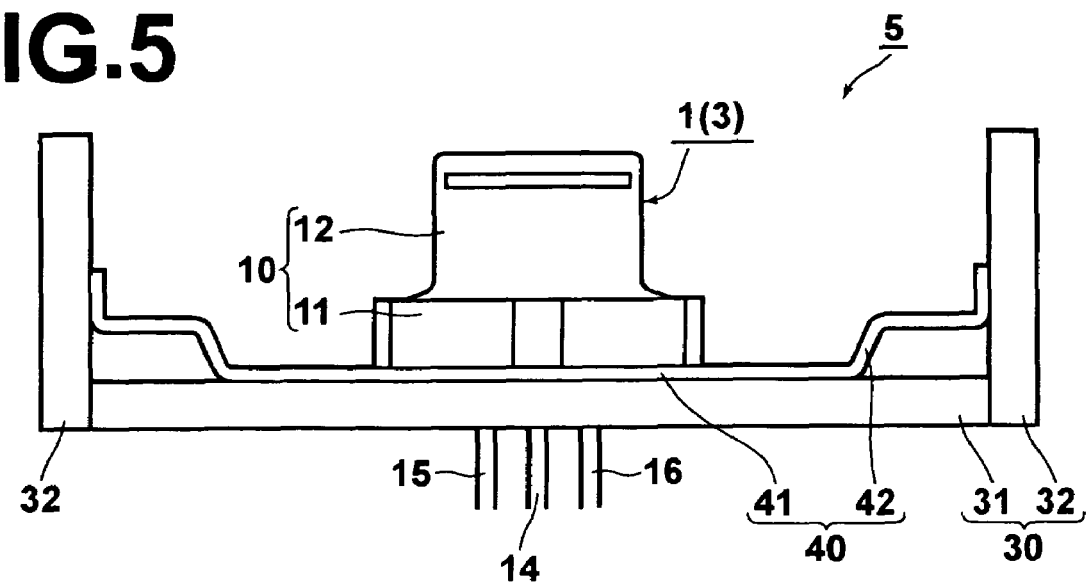
FIG. 5 is a diagram illustrating a design modification example.

In the above embodiment, a case in which the heat radiation support 30 is a heat radiation plate, and in which the shape of the flexible heat radiation member 40 is a flat plane which is approximately the same as the shape of the package base 11, has been described. Particularly, it is preferable to form the heat radiation support 30 and the flexible heat radiation member 40, as illustrated in FIG. 5. In FIG. 5, the heat radiation support 30 has a base plate 31 and a side wall 32. The base plate 31 supports the bottom of the package base 11, and the area of the base plate 31 is larger than that of the bottom of the package base 11. The side wall 32 is arranged on the base plate 31 at a position spaced from the laser package 1 (3). The side wall 32 is arranged so as to face the laser package 1 (3). Further, the flexible heat radiation member 40 includes a portion 41 and a portion 42. The portion 41 is a portion between the bottom of the package base 11 and the base plate 31. The portion 42 is a portion which extends from the portion 41 to be connected to the side wall 32 of the heat radiation support 30. A laser module 5 illustrated in FIG. 5 is preferable because heat can be efficiently radiated. In the laser module 5, heat radiated from the laser package 1 (3) also is efficiently diffused from the portion 42 and the side wall 32 of the heat radiation support 30. The portion 42 is a projecting portion of the flexible heat radiation member 40, which projects from the laser package 1 (3). It is most preferable that the side wall 32 is formed in a cylindrical shape along the outer circumference of the base plate 31. However, the formation range of the side wall 32 may be appropriately designed.

In the above descriptions, the flexible heat radiation member 40 is not an element of each of the laser packages 1 and 3. However, the flexible heat radiation member 40 may be an element of each of the laser packages 1 and 3.

In the above embodiment, a case in which each of the laser packages 1 and 3 is attached to the heat radiation support 30, such as a heat radiation plate, has been described. However, each of the laser packages 1 and 3 may be attached to an arbitrary heat radiation member, such as the heat radiation support (heat radiation plate or the like) 30 and a cooling device (Peltier device or the like), to form a laser module. It is preferable to attach each of the laser packages 1 and 3 to the heat radiation support (heat radiation plate or the like) 30 to reduce the size. In the present invention, it is possible to achieve an efficient heat radiation characteristic without using a cooling device.

In the above embodiment, the laser packages 1 and 3, each including a single laser device 20, have been described. However, in the present invention, a plurality of laser devices 20 may be used. The present invention may be adopted in a laser package including a plurality of laser devices 20. When the plurality of laser devices 20 is used, it is preferable that each of the laser devices 20 is mounted on respective heat radiation blocks 13 which are different from each other. Further, it is preferable that a plurality of heat radiation blocks 13 is aligned and arranged in the can package 10.

The number of the lead pins may be appropriately designed based on the number of the laser devices 20 or the like. Further, the number of the insertion holes formed on the heat radiation support 30 and the number of the insertion holes formed on the flexible heat radiation member 40 may be less than that of the lead pins. In such a case, a plurality of lead pins may be inserted through the same insertion hole. When a plurality of lead pins is inserted through the same insertion hole, a gap between the lead pin/pins and the insertion hole can be reduced for a portion on which surface insulating processing has been performed. Therefore, it is possible to provide a laser package and a laser module which have a more efficient heat radiation characteristic than a conventional technique.

The laser package and the laser module of the present invention have efficient heat radiation characteristics. Therefore, the laser package and the laser module of the present invention are effective when the amount of heat generated in the laser package is high. For example, when a high output laser device, such as a GaN-based semiconductor laser device, of which the output power is approximately 200 mW, is used as the laser device 20, the heat amount is high. In the present invention, even when a high output laser device is used, it is possible to suppress thermal deterioration of the laser device 20. Therefore, the present invention has an advantageous effect that stable performance is possible for a long time. Hence, stable output can continue.

EXAMPLE

An example of the present invention and a comparative example will be described.

Comparative Example 1, Example 1

A package base and a cap of a can package (5.6 mmφ) are made of stainless steel (SUS304, thermal conductivity: 16 W/m·K). A single GaN-based semiconductor laser device (output power: 200 mW) is placed in the can package, and the can package is hermetically sealed. Then, all of three lead pins (outer diameter: 0.5 mmφ) project from the package base. Heat radiation of such a laser package has been evaluated.

In comparative example 1, surface insulating processing is not performed on a projecting portion of each of the lead pins, which projects from the package base to the outside of the package base. In comparative example 1, a change in temperature at the central portion on the bottom of the package base is measured, using a thermocouple, from the start of a drive operation. At the same time, a change in an output light amount is detected using a photo diode in the laser package. A difference between the device temperature of the laser device and the temperature at the bottom of the package base is kept approximately constant, and both of the temperatures indicate similar behavior to each other. Therefore, if a change in temperature at the bottom of the package base is measured, it is possible to indirectly evaluate a change in the temperature of the laser device.

In example 1, surface insulating processing is performed on two lead pins, which are all of the lead pins except the lead pin for fixing, by coating a projecting portion of each of the two lead pins, which projects from the package base, with a polyimide resin tube (Tg: 220° C.) which has a thickness of 60 μm. Accordingly, the laser package according to the above embodiment is obtained. Then, a graphite sheet (thermal conductivity: 500 W/m·K, a thickness of 100 μm), which is a flexible heat radiation member, and an Al heat radiation plate (thermal conductivity: 238 W/m·K, a thickness of 5 mm), which is a heat radiation support, are attached to the laser package 1. Accordingly, the laser package 2 according to the above embodiment is obtained.

Then, a change of an output light amount is measured for the laser module of example 1 in a manner similar to measurement of the output light amount in comparative example 1. In example 1, the flexible heat radiation member or the like is attached to the laser package 1. Therefore, a change in temperature at the bottom of the package base is not measured.

(Results)

Figure 6A:
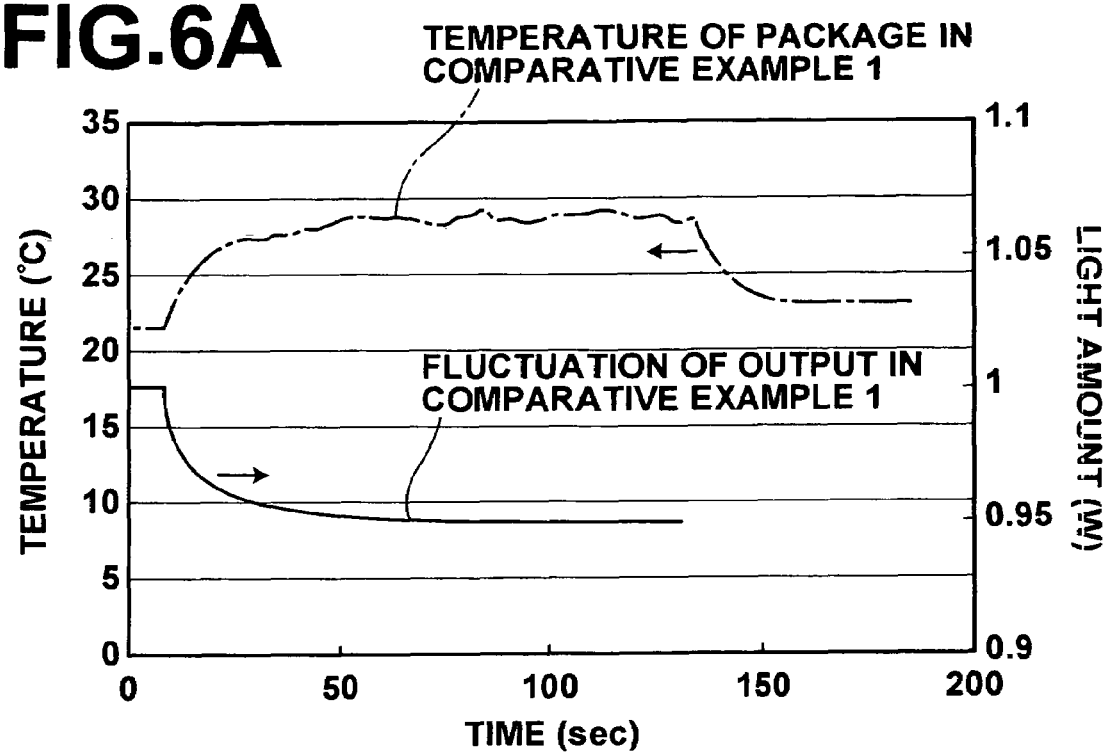
FIG. 6A is a graph illustrating an evaluation result of comparative example 1.
Figure 6B:
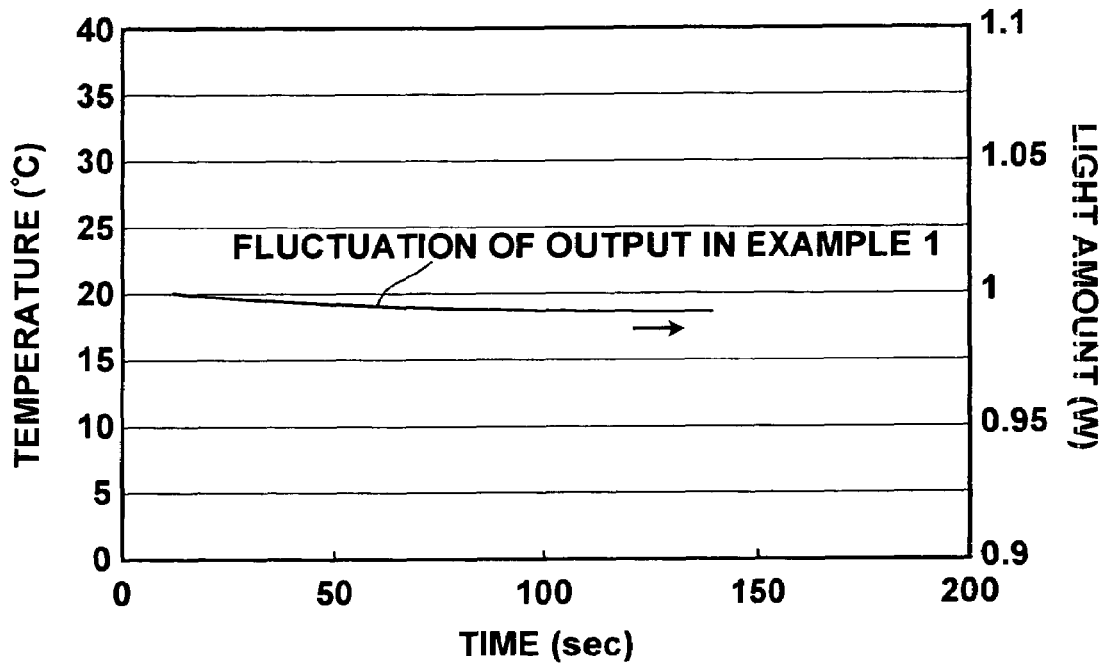
FIG. 6B is a graph illustrating an evaluation result of example 1.
Figure 7A:
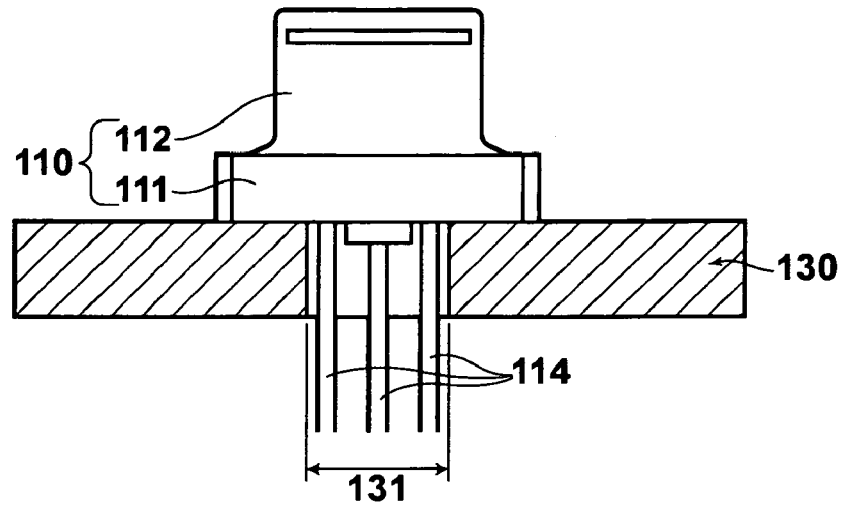
FIG. 7A is a diagram illustrating the structure of a laser package according to the related art.
Figure 7B:
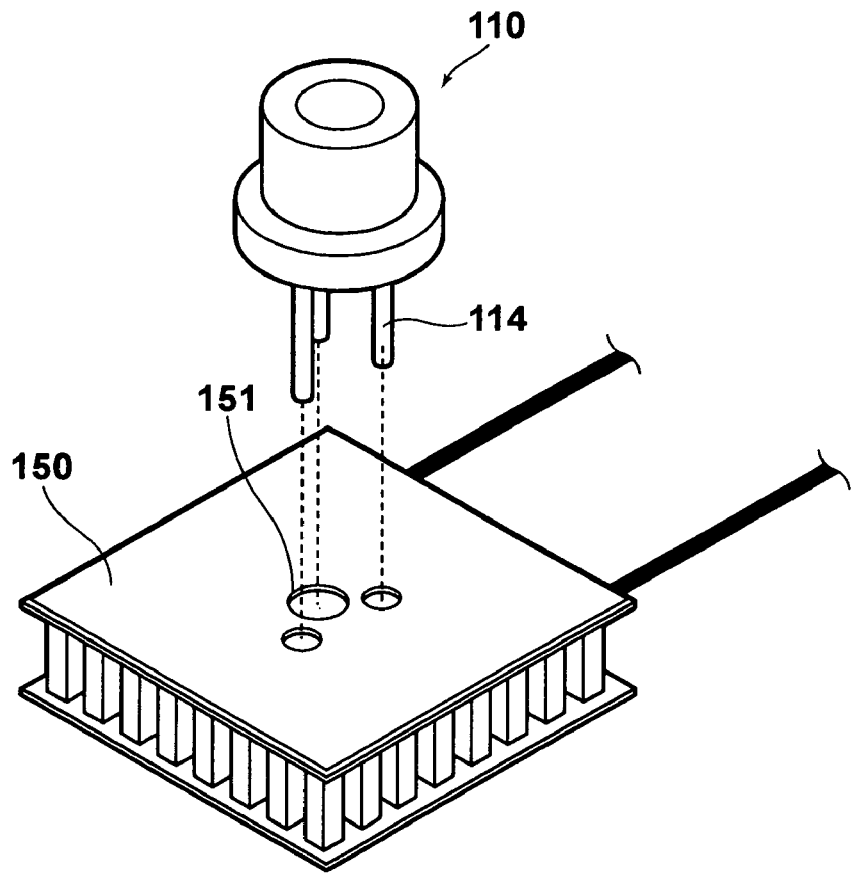
FIG. 7B is a diagram illustrating the structure of a laser package according to the related art.

The results are illustrated in FIGS. 6A and 6B. As illustrated in FIG. 6A, the temperature of the laser device rises as soon as a drive operation starts and an output light amount from the laser device decreases in the laser package of comparative example 1, in which surface insulating processing has not been performed on the lead pins. In contrast, as illustrated in FIG. 6B, a stable output light amount is achieved in the laser module of example 1. These results show that it is possible to efficiently radiate heat from the laser package in the laser module of example 1 and that an increase in the temperature of the laser device is prevented.

We could confirm, based on the above evaluation, that it is possible to achieve efficient heat radiation in the present invention even when a laser device of approximately 200 mW, of which the output is high, and of which the electric/photo conversion efficiency is low, and of which the heat amount is large, is used.

The laser module according to the present invention can be utilized in a preferable manner for optical communication, a laser processing machine, a light source for exciting a solid-state laser and a high luminance lighting.

What is claimed is:

1. A laser module comprising:
a laser package including at least one laser device and a hermetically sealed package having a package base and a cap with a light transmissive window for emitting light, wherein the at least one laser device is placed in the package; and a heat radiation support for supporting the package base of the laser package from the bottom of the package base, and wherein the thermal conductivity of the heat radiation support is higher than that of the package base, and wherein the laser device is fixed onto the package base of the laser package, and wherein a plurality of lead pins including a lead pin for supplying drive current to the laser device projects from the package base of the laser package, and wherein the heat radiation support has at least one insertion hole for inserting the lead pin/pins therethrough, and wherein surface insulating processing has been performed on a projecting portion of at least one of the lead pins and/or the inner surface of at least one of the at least one insertion hole, and wherein the projecting portion of at least one of the lead pins is a portion which projects from the package base to the outside of the package base, wherein the lead pin and/or the insertion hole, on which surface insulating processing has been performed, are a lead pin and/or an insertion hole, each coated with one of an insulating resin tube and an insulating resin layer, wherein the package base is supported by the heat radiation support through a flexible heat radiation member having at least one insertion hole for inserting the lead pin/pins therethrough, and wherein the thermal conductivity of the flexible heat radiation member is higher than that of the package base, wherein the heat radiation support has a base plate and a side wall, and wherein the base plate supports the bottom of the package base, and wherein the area of the base plate is larger than that of the bottom of the package base, and wherein the side wall is arranged at a position on the base plate to be spaced from the laser package and to face the laser package, and wherein the flexible heat radiation member has a portion between the bottom of the package base and the base plate and a portion extending from the portion between the bottom of the package base and the base plate so as to be connected to the side wall.

2. A laser package comprising:

at least one laser device; and a hermetically sealed package including a package base and a cap having a light transmissive window for emitting light, wherein the at least one laser device is placed in the package and fixed onto the package base, and wherein a plurality of lead pins including a lead pin for supplying drive current to the laser device projects from the package base, and wherein surface insulating processing has been performed on an projecting portion of at least one of the lead pins, and wherein the projecting portion is a portion which projects from the package base to the outside of the laser package, wherein the lead pin, on which surface insulating processing has been performed, is a lead pin coated with one of an insulating resin tube and an insulating resin layer, wherein a flexible heat radiation member having at least one insertion hole for inserting the lead pin/pins therethrough is attached to the bottom of the package base, and wherein the thermal conductivity of the flexible heat radiation member is higher than that of the package base, wherein one of the plurality of lead pins is formed so as to have a top portion and a bottom portion, wherein a diameter of the top portion is larger than a diameter of the bottom portion, wherein the flexible heat radiation member is arranged along a bottom surface of the package base and a bottom surface of the larger diameter of the top portion of the one lead pin, and wherein a depression is formed on a surface of a heat radiation support so as to correspond to a shape of the large diameter of the top portion of the one lead pin.

* * * * *